United States Patent [19]
Yano et al.

[11] Patent Number: 5,714,801
[45] Date of Patent: Feb. 3, 1998

[54] SEMICONDUCTOR PACKAGE

[75] Inventors: Keiichi Yano; Jun-ichi Kudo, both of Yokohama, Japan; Koji Yamakawa, State College, Pa.; Kiyoshi Iyogi, Kawasaki, Japan

[73] Assignee: Kabushiki Kaisha Toshiba, Kanagawa-ken, Japan

[21] Appl. No.: 624,081

[22] Filed: Mar. 29, 1996

[30] Foreign Application Priority Data

Mar. 31, 1995 [JP] Japan ............... 7-074827

[51] Int. Cl.$^6$ .................................... H01L 23/52
[52] U.S. Cl. ............................ 257/691; 257/700
[58] Field of Search ..................... 257/691, 700, 257/697

[56] References Cited

U.S. PATENT DOCUMENTS 5,309,024  5/1994  Hirano ...................... 257/691
5,543,661  8/1996  Sumida ..................... 257/700

FOREIGN PATENT DOCUMENTS

0414204A3  2/1991  European Pat. Off. ........ 257/700
7-27164    5/1995  Japan.

*Primary Examiner*—Mahshid D. Saadat
*Assistant Examiner*—S. V. Clark
*Attorney, Agent, or Firm*—Finnegan, Henderson, Farabow, Garrett & Dunner, L.L.P.

[57] ABSTRACT

A semiconductor package is disclosed which is provided with a multilayer ceramic substrate such as, for example, a multilayer aluminum nitride substrate having a surface for mounting a semiconductor device and, at the same time, having an inner wiring layer electrically connected to the semiconductor device. On the surface of the multilayer ceramic substrate for forming terminals thereon, input and output terminals such as, for example, pin terminals and bump terminals electrically connected to the inner wiring layer. The input and output terminals embrace signal terminals, ground terminals, and power source terminals. The signal terminals among other terminals are so disposed that they may be each positioned adjacently to at least one ground terminal or power source terminal. This semiconductor package possesses perfect transmission properties even for signals of such a high frequency as exceeds the order of GHz. The dispersion of the transmission properties is small.

12 Claims, 8 Drawing Sheets

SEMICONDUCTOR PACKAGE

BACKGROUND OF THE INVENTION

1. Field of the Invention

This invention relates to a semiconductor package aimed at improvement in high-frequency transmission property.

2. Description of the Related Art

Generally for packaging semiconductor elements, plastic packages, metal packages, and ceramic packages have been used. Since ceramic packages excel other packages in terms of such properties as insulation, radiation of heat, and resistance to moisture, they have been in use for packaging CMOS gate arrays, ECL gate arrays, etc. which are used in the arithmetic sections of computers.

In recent years, the numbers of input and output signals per semiconductor device have been increasing proportionately to the growth in scale of the integration of semiconductor devices. The amounts of heat emanating from semiconductor devices have been similarly tending upward. The demands placed as a consequence on semiconductor packages for admitting the growing numbers of input and output signals and, at the same time, acquiring improvement in the property of heat radiation have been gaining in earnestness.

In the circumstances, ceramic PGA (pin grid array) packages and ceramic BGA (ball grid array) packages which easily admit multiplication of terminals and, at the same time, excel in the property of heat radiation as compared with QFP (quad flat packages), etc. have been attracting attention. The use of such ceramic PGA packages and BGA packages as mentioned above permits multiplication of terminals in a semiconductor device and copes effectively with the growth of the amount of heat emanating from the semiconductor device.

The latest semiconductor devices, however, are conspicuously tending toward exaltation of operating frequency with a view to heightening the operating speed. Though the ceramic PGA packages and ceramic BGA packages of the conventional structure are capable of admitting signals of high frequency of the order of the MHz region, it is suspected that they have the possibility of entailing the following problem when the signals have a high frequency exceeding the order of GHz.

For example, the transmission properties of the PGA packages and BGA packages of the conventional structure are dispersed by the positions at which signal lines are disposed in the packages. This dispersion of transmission property implies partial decline of the transmission properties of signal lines. This partial decline of transmission property is problematic in that it disposes the PGA packages and BGA packages of the conventional structure to induce erroneous operations in the semiconductor devices.

The latest semiconductor devices have been tending toward wider freedom of design as evident in ASIC. As a result, it has become increasingly difficult for the signal passage properties of the individual signal lines to be fixed preparatorily on the package side. A demand is placed, therefore, on the packages for enabling a very large number of their signal lines severally to attain an improved high-frequency transmission property.

In consequence of the aforementioned trend of the latest semiconductor devices toward greater scale of integration and higher operating speed, the demands placed on the semiconductor packages such as the capacity for admitting growing numbers of input and output signals, the ability to radiate an increasing amount of heat, the improvement in the capacity for transmitting signals of higher frequency, the prevention of dispersion of the transmission property, and the preclusion of erroneous operations due to the dispersion have been growing in exactitude year after year.

For the purpose of adding to the numbers of input and output signals and enlarging the capacity for radiation of heat, for example, the PGA packages or BGA packages made of ceramics are used effectively. Since the property of transmitting signals of a high frequency exceeding the order of GHz admits of dispersion ascribable to such factors as the positions of signal lines, however, the packages are demanded to prevent dispersion of the property to transmit signals of higher frequency and preclude the occurrence of erroneous operations due to the dispersion.

SUMMARY OF THE INVENTION

It is an object of this invention, therefore, to provide a semiconductor package which enables a semiconductor device to permit practical addition to the scale of integration and the operating speed thereof. To be specific, this invention aims to provide a semiconductor package which admits addition to the numbers of input and output signals due to the heightened scale of integration of a semiconductor device and addition to the amount of heat emanating from the semiconductor device, permits improvement in the property of transmission of signals of a high frequency caused to exceed the order of GHz in consequence of the addition to the operating speed of the semiconductor device and, at the same time, allows repression of the dispersion of the signal transmission property.

The semiconductor package of this invention is characterized by comprising a multilayer ceramic substrate having a surface for mounting a semiconductor device thereon and a surface for forming terminals thereon and having an inner wiring layer electrically connected to the semiconductor device and a group of input and output terminals electrically connected to the inner wiring layer and comprising signal terminals, ground terminals, and power source terminals disposed on the surface of the multilayer ceramic substrate for forming terminals thereon, the main ones of the signal terminals being disposed adjacently to at least one of the ground terminals or power source terminals.

As main factors for affecting the transmission property of signals of such a high frequency as exceeds the order of GHz, the lengths of signal lines distributed, the presence or absence of plated lines, and the electromagnetic coupling of signal lines with the standard potential lines of the ground lines and the power source lines are conceivable. In these factors, the degree of electromagnetic coupling of the signal lines with the standard potential lines has a large effect on the transmission property of high-frequency signals. Particularly in the PGA package or BGA package made of ceramics, the paths for the flow of a return current to the standard potential lines have a large effect on the transmission property of high-frequency signals because the package uses a multilayer ceramic substrate containing an inner wiring layer. The transmission property of signals of such a high frequency as exceeds the order of GHz can be improved and the dispersion of the transmission property can be repressed by curbing the dispersion of the lengths of paths for the flow of the return current and, at the same time, diminishing the difference in electromagnetic coupling between the signal lines and the standard potential lines to the fullest possible extent. The present invention has been perfected on the basis of this knowledge.

In the semiconductor package of this invention, the main signal terminals is disposed adjacently to at least one of the ground terminals or power source terminals. To be specific, not less than 50% of the signal terminals are disposed adjacently to at least one of the ground terminals or power source terminals. As a result, the paths for the return current based on the main signal terminals can be decreased in length and, at the same time, the dispersion thereof can be repressed to a great extent. Further, the condition of the electromagnetic coupling between the main signal terminals and the ground terminals or power source terminals can be approximately fixed. As a result, the high-frequency transmission property of the signal lines can be improved and, at the same time, the dispersion thereof can be repressed. The semiconductor package of this invention, therefore, is enabled to mount a semiconductor device of varying design freely thereon and prevent the semiconductor device so mounted thereon from producing erroneous operations.

DESCRIPTION OF THE PREFERRED EMBODIMENTS

Now, embodiments of this invention will be described below with reference to the drawings annexed hereto.

Figure 1:
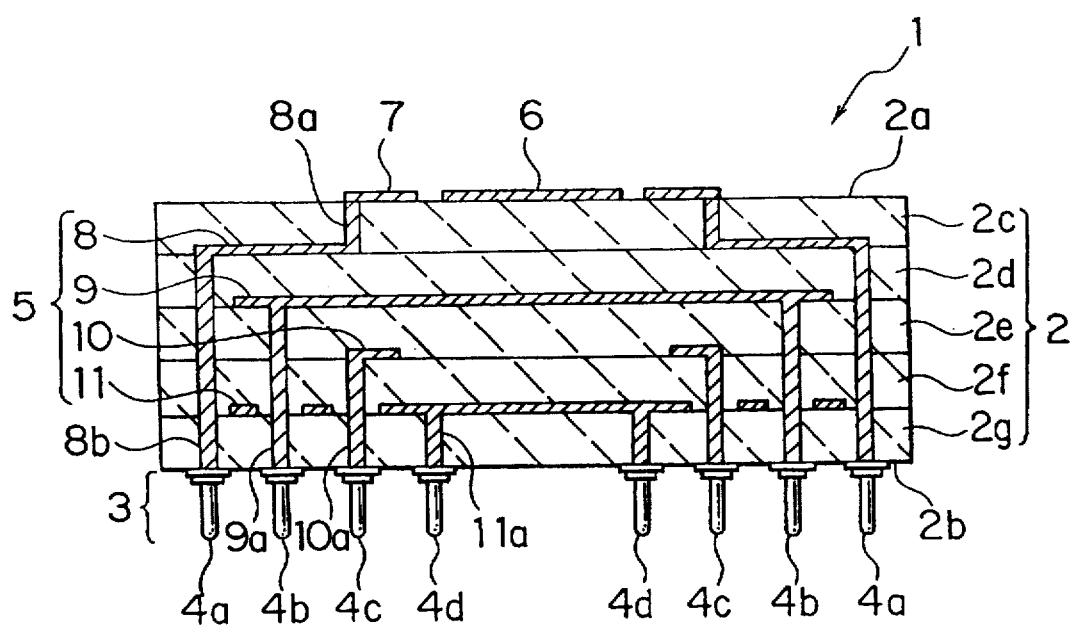
FIG. 1 is a cross section showing the structure of one example of a semiconductor package of this invention applied to a PGA package.

FIG. 1 is a cross section showing the structure of one example of a semiconductor package of this invention applied to a PGA package. This PGA package can be applied in both a surface mount type PGA and an insertion mount type PGA.

A semiconductor package 1 shown in the diagram is chiefly composed of a multilayer aluminum nitride substrate 2 having an upper surface 2a thereof adapted to serve as a surface for mounting such a semiconductor device as the CMOS gate array or ECL gate array and a lower surface 2b thereof, i.e. the surface opposite to the device-mounting surface, adapted to serve as a surface for forming terminals and a group of input and output pins 3 (input and output pins I/O pins 4) joined to the terminal-forming surface 2b of the multilayer aluminum nitride substrate 2.

The multilayer aluminum nitride substrate 2 is a multi-layer wiring substrate formed by superposing five aluminum nitride layers 2c, 2d, 2e, 2f, and 2g into one-piece mass. Inner wiring layers 5 severally provided with prescribed wire patterns as specifically described herein below are formed on the individual aluminum nitride layers. The multilayer aluminum nitride substrate 2 of the structure described above is manufactured, for example, by co-firing the substrate (consisting of individual aluminum nitride layers) itself and an electroconductive substance destined to form inner wiring layers.

The group of input and output pins 3 mentioned above are disposed on the lower surface (terminal-forming surface) 2b of the multilayer aluminum nitride substrate 2 as regularly arrayed in a latticelike pattern. The group of input and output pins 3 are electrically connected to the inner wiring layers 5 disposed in the multilayer aluminum nitride substrate 2.

Now, the structure of the inner wiring layers 5 which are disposed inside the multilayer aluminum nitride substrate 2 mentioned above and the relation between the inner wiring layers 5 and the group of input and output pins 3 will be described in detail below. The relation between the inner wiring layers 5 and the group of input and output pins 3 to be described herein below concerns part of the inner wiring layers 5 shown in FIG. 1. All the input and output pins of the group 3 do not satisfy the relation shown in FIG. 1.

On the uppermost or the first aluminum nitride layer 2c, a chip-mounting part 6 and a surface wiring layer 7 are formed as, for example, by co-firing in the same manner as the inner wiring layers 5. On the second aluminum nitride layer 2d, a first signal wiring layer 8 having a prescribed wiring pattern adapted to draw around part of signal lines is disposed.

One end of the first signal wiring layer 8 is electrically connected to the surface wiring layer 7 through the medium of a via hole 8a filled with an electroconductive substance. The other end of the first signal wiring layer 8 is electrically connected to a similar via hole 8b extended to the lower surface 2b of the multilayer aluminum nitride substrate 2. The via hole 8b is electrically connected to a input and output pin 4a which are positioned on the radially outermost part in all the input and output pins of the group 3. This input and output pin 4a constitutes signal pin (signal terminal).

A ground wiring layer 9 is disposed on the third aluminum nitride layer 2e. This ground wiring layer 9 is formed in a planar shape (flat sheet) wholly on the third aluminum nitride layer 2e. The ground wiring layer 9 is electrically connected to the surface wiring layer 7 through the medium of a via hole which is omitted from illustration. The ground wiring layer 9 is electrically connected to a via hole 9a extended to the lower surface 2b of the multilayer aluminum nitride substrate 2. The via hole 9a is electrically connected to a input and output pin 4b which are disposed adjacently to the input and output pin 4a destined to serve as the signal pin as described above. This input and output pin 4b constitutes ground pin (ground terminals).

Then, on the fourth aluminum nitride layer 2f, a second signal wiring layer 10 having a prescribed wiring pattern adapted to draw around the remaining signal lines is disposed. One end of the second signal wiring layer 10 is electrically connected to the surface wiring layer 7 through the medium of a via hole which is omitted from illustration. The other end of the second signal wiring layer 10 is electrically connected to a via hole 10a which is extended to the lower surface 2b of the multilayer aluminum nitride substrate 2. The via hole 10a is electrically connected to a input and output pin 4c which are disposed adjacently to the input and output pin 4b destined to serve as the ground pin. This input and output pin 4c constitutes signal pin (signal terminal).

A power source wiring layer 11 is disposed on the fifth aluminum nitride layer 2g. This power source wiring layer 20 is formed in a planar shape (flat sheet) on the fifth aluminum nitride layer 2g. The power source wiring layer 10 is electrically connected to the surface wiring layer 7 through the medium of a via hole which is omitted from illustration. The power source layer 11 is electrically connected to a via hole 11a which is extended to the lower surface 2b of the multilayer aluminum nitride substrate 2. The via hole 11a is electrically connected to a input and output pin 4d disposed adjacently to the input and output pin 4c destined to serve as the signal pin mentioned above. This input and output pin 4d constitutes power source pin (power source terminal).

The inner wiring layers 5 of the multilayer aluminum nitride substrate 2 are formed of the signal wiring layers 8 and 10, the ground wiring layer 9, the power source wiring layer 11 and the via holes electrically connected to the layers mentioned above.

The group of input and output pins 3 shown in FIG. 1 are so arranged that the ground pin 4b or the power source pin 4d of the standard potential may be allowed to be disposed adjacently to the signal pins 4a and 4c by suitably selecting the positions for forming the inner wiring layers 5 and the manner of drawing around relevant lines. The signal wiring layers 8, 10 and the power source wiring layer 11 are alternately superposed to form the multilayer aluminum nitride substrate 2 as mentioned above. In other words, the signal wiring layers 8, 10 connected respectively to the signal wires 4a, 4c are disposed adjacently to the ground wiring layer 9 and the power source wiring layer 11 respectively.

Figure 2:
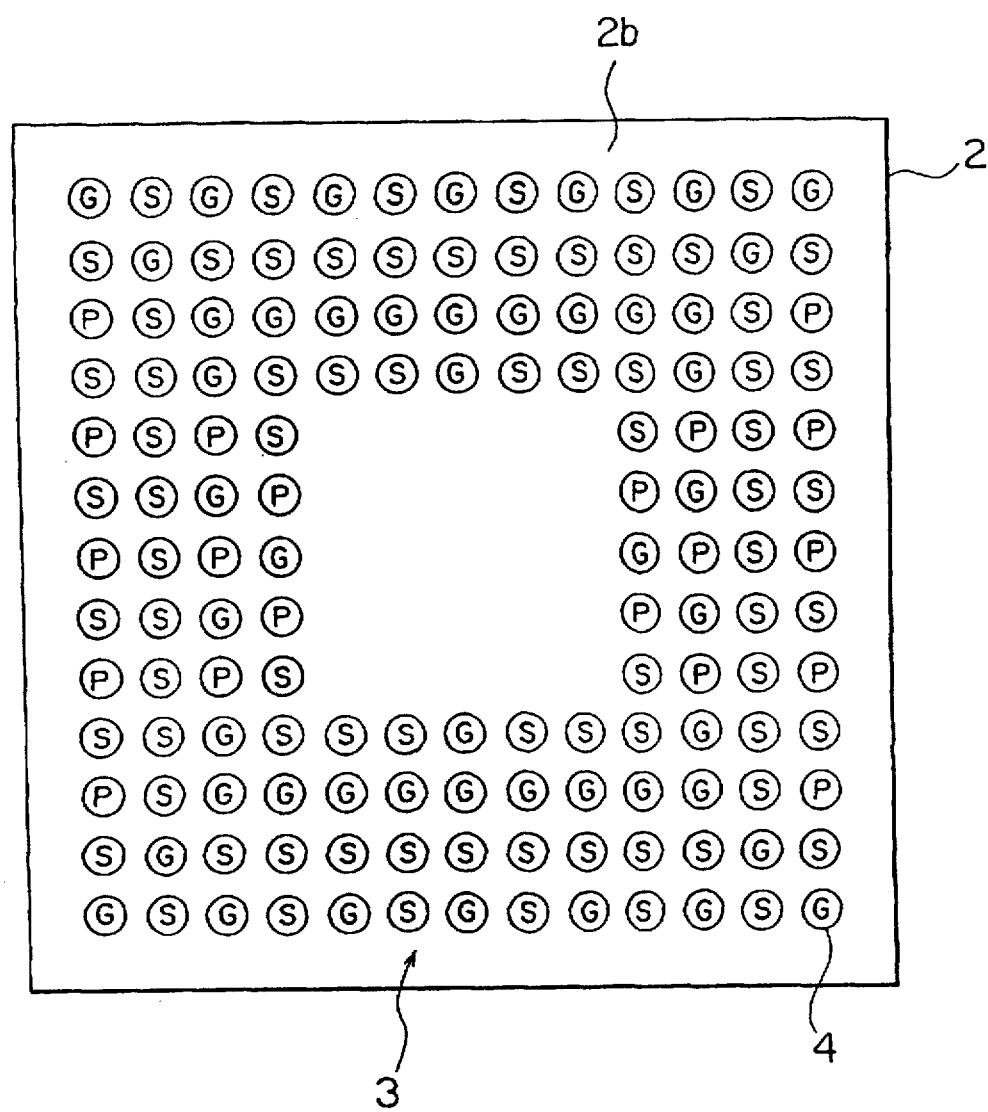
FIG. 2 is a diagram showing one example of the layout of input and output pins in the PGA package shown in FIG. 1.

The input and output pins 4a, 4b, 4c, and 4d described above with reference to FIG. 1 are part of the group of input and output pins 3. One example of the whole layout of the group of input and output pins 3 is shown in FIG. 2. As shown in FIG. 2, the group of input and output pins 3 are regularly arrayed after the pattern of a lattice. The signal pins S are so disposed that they are each positioned adjacently to at least one ground pin G or power source pin P. At least one of the four adjacent positions for every signal pins S in the array, therefore, is occupied by a ground pin G or a power source pin P. The remaining adjacent positions are not necessarily occupied by ground pins G or power source pins P but may be occupied by other signal pins S as shown in FIG. 2.

In the semiconductor package 1 of the present embodiment, the group of input and output pins 3 are so arrayed that either a ground pin G or a power source pin P may occupy at least one of the four adjacent positions for every signal pin S in the array as described above. All the signal pins S, therefore, lie adjacently to one ground pin G or a power source pin P without fail. By the adoption of this arrangement of pins, the lengths of paths for the flow of return current can be shortened and, at the same time, the dispersion in the lengths of the paths for the return current can be repressed.

Figure 3:
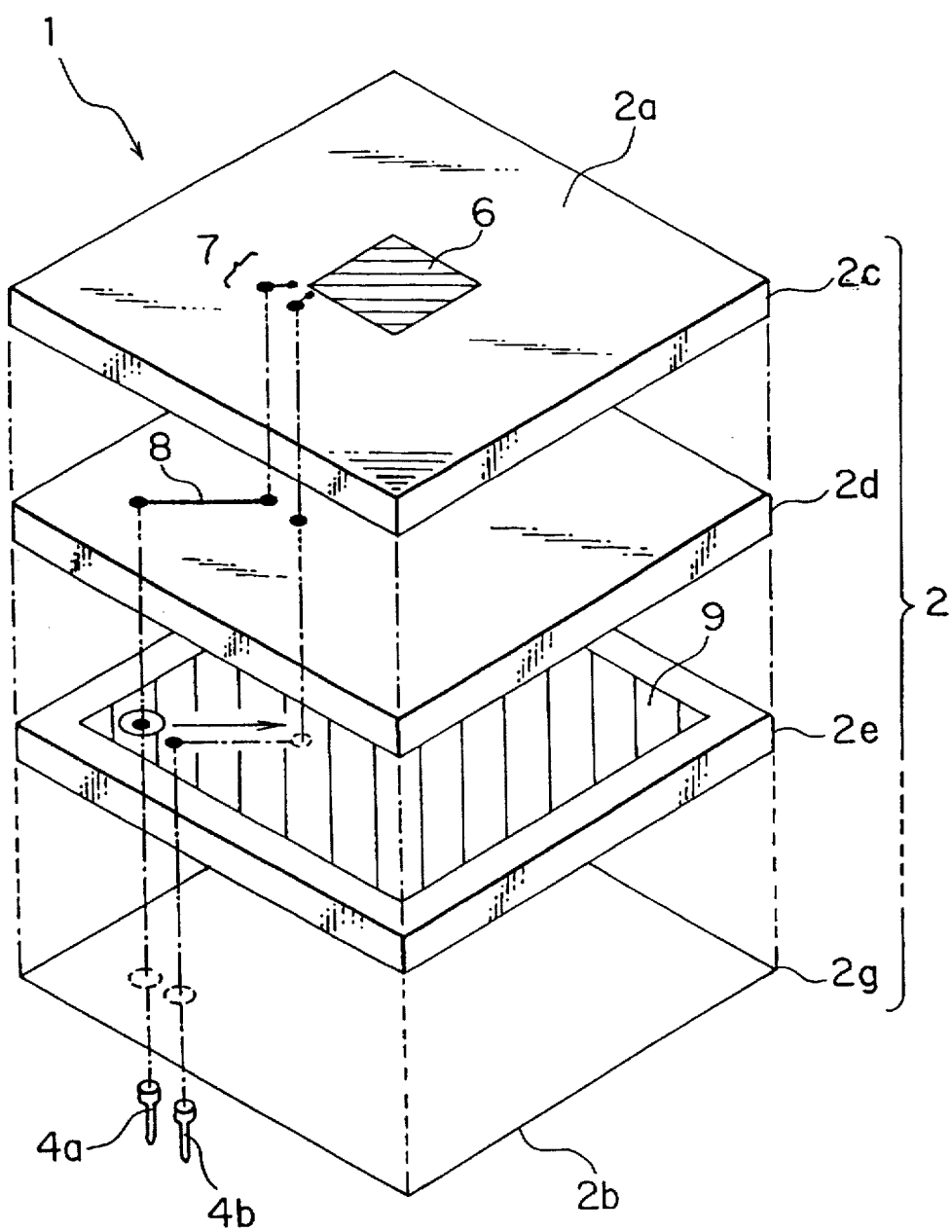
FIG. 3 is an exploded perspective view showing the structure of the essential part of the PGA package shown in FIG. 1.

FIG. 3 is an exploded perspective view showing the essential parts of the surface wiring layer 7, part of the first signal wiring layer 8, and the ground wiring layer 9 in the component layers of the semiconductor package 1 shown in FIG. 1. When a signal current flows to the signal wiring layer 8 in this structure, a return current consequently flows to the adjacent ground wiring layer 9. The length of the path for the flow of this return current has a large effect on the transmission property of the high-frequency signal. Specifically, the transmission property of the high-frequency signal is degraded in proportion as the length of the path for the flow of the return current increases.

The path for the flow of the return current is affected in a great measure by the positions at which the ground pin 4b and the power source pin 4d are formed. As shown in FIG. 3, the ground pin 4b exists at the position adjacent to that of the signal pin 4a. When the signal current flows to the signal wiring layer 8 which is connected to the signal pin 4a, the return current (indicated by an arrow mark in FIG. 3) flows depending on the position at which the ground pin 4b adjacent to the signal pin 4a is formed. Thus, the length of the path through which the return current flows to the ground wiring layer 9 can be shortened. The same remark holds good for the case in which the signal pin 4a is disposed adjacently to the power source pin 4d.

Since every signal pin S is disposed adjacently to at least one ground pin G or a power source pin P as shown in FIG. 2, the lengths of the paths for the flow of the return current based on all the signal wirings can be shortened. Owing to this structure, the lengths of the paths for the flow of the return current can be shortened and, at the same time, the dispersion of lengths of the paths for the flow of the return current can be repressed. As a result, the high-frequency transmission properties of all the signal wirings can be improved. It is also made possible to repress the dispersion of the high-frequency transmission properties.

Figure 4:
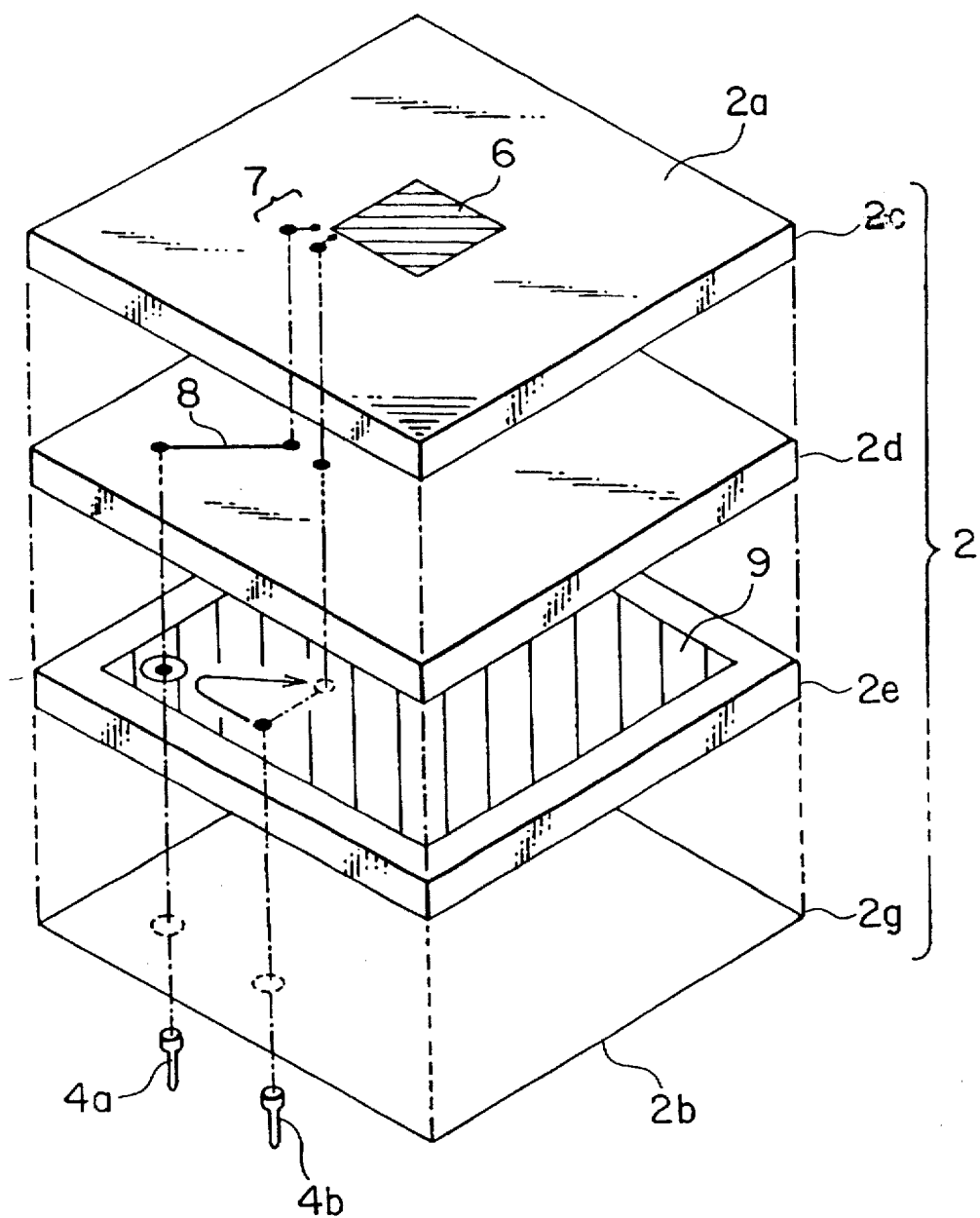
FIG. 4 is an exploded perspective view of the essential part of a PGA package shown as an example for comparison with this invention.

In contrast, when neither a ground pin nor a power source pin exists at a position adjacent to the position of the signal pin 4a as shown in FIG. 4, the length of the path for the flow of a return current (indicated by an arrow mark in FIG. 4) is increased. By the dispersion in the distances between the signal pins to the ground pins or the power source pins, the lengths of the paths for the flow of the return current in the individual signal wirings are varied. This invention resides in repressing the degradation of the high-frequency transmission property due to such dispersion in the lengths of the paths for the flow of the return current as described above. From the description given above, it ought to be plain that the positional relation between the signal points and the ground pins or the power source pins has a large effect on the high-frequency transmission property.

Further in the semiconductor package 1 of this embodiment, the signal wiring layers 8, 10 and the ground wiring layer 9 and the power source wiring layer 11 are alternately disposed. As a result, the conditions of electromagnetic coupling between the signal wiring layers 8, 10 and the planar ground wiring layer 9 and the power source wiring layer 11 can be approximately fixed. This fact contributes greatly to controlling the impedances of the signal wiring layers 8, 10. The stabilization of the transmission property of a high-frequency signal, therefore, can be promoted by approximately fixing the impedances of the individual signal wiring layers 8, 10.

The planar ground wiring layer 9 and the power source wiring layer 11 manifest their effects also in shortening the paths for the flow of the return current.

The semiconductor package 1 of this embodiment, as described above, shortens the lengths of the paths for the flow of the return current based on all the signal wirings 8, 10 and also represses the dispersion in the lengths of the paths. It also controls the impedances of the individual signal wiring layers 8, 10. All these factors go to make it possible to improve the high-frequency transmission properties of all the signal wirings. This fact implies that the semiconductor package 1 permits a semiconductor device of a varying design to be freely mounted thereon.

The latest semiconductor devices have been tending toward wider freedom of design as evident in ASIC. As a result, it has become increasingly difficult for the signal passage properties of the individual signal lines to be fixed preparatorily on the package side. In the existing state of affairs described above, by heightening the high-frequency transmission properties of all the signal wirings, the semiconductor device of any kind mounted on the semiconductor package 1 is prevented from producing an erroneous operation and enabled to operate ideally.

Figure 5:
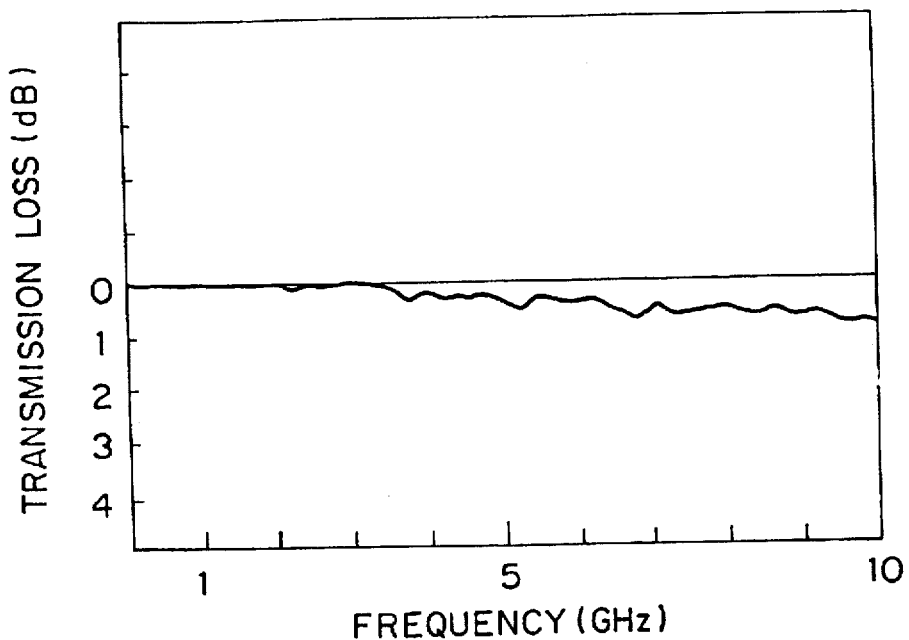
FIG. 5 is a diagram showing one example of the relation between the frequency and the transmission loss obtained of signal lines in the PGA package shown in FIG. 1 and FIG. 2.

FIG. 5 shows the results of actual measurement of transmission properties ($S_{21}$ parameters) of the signal lines (8, 10, 4a, and 4c) in the inner wiring layer 5 of the semiconductor package 1 provided with the group of input and output pins 3 as shown in FIG. 2 by the use of a network analyzer having a band width of from 0.1 GHz to 10.1 GHz (produced by Hewlet Packard and marketed under trademark designation of "HP 8510C"). FIG. 5 depicts the relation between the working frequency and the transmission property (transmission loss).

The procedure used for this measurement was as follows. Two adjacent ones of the signal wirings were selected randomly. The two selected signal wirings were short-circuited to each other on the surface wiring layer 7 side. An input was introduced through the signal pin S of one of the signal wirings, passed through the signal wiring layer, relayed to another signal wiring layer through the medium of the short-circuited surface wiring layer 7, and discharged as an outlet via the other signal pin S. All the ground wiring layers and the power source wiring layers 11 involved in this case were invariably short-circuited.

For comparison with this invention, a semiconductor package of the conventional structure was manufactured. Specifically, power source pins and ground pins were collectively disposed near the center of the lower surface of a multilayer aluminum nitride substrate and signal pins were disposed around them. This package was manufactured with the same materials in the same structure as the semiconductor package of the embodiment mentioned above except for the arrangement of the group of input and output pins. In the semiconductor package for comparison, the transmission properties ($S_{21}$ parameters) of the signal lines were measured in the same manner as in the embodiment. The signal wirings (signal pints) selected for this measurement were such that all the positions adjacent thereto were invariably occupied by other signal pins. The results of this measurement are shown in terms of the relation between the working frequency and the transmission property (transmission loss) in FIG. 6.

It is clearly noted from FIG. 5 that in the semiconductor package 1 according to the embodiment described above, the transmission loss was small throughout all the region of frequency covered by the measurement and that the transmission property was excellent for signals of high frequency in the order of GHz. When the transmission property was measured with respect to the other signal wirings, similarly excellent results were obtained in all the signal wirings. These results indicate that the dispersion in the transmission properties of high-frequency signals was small.

Figure 6:
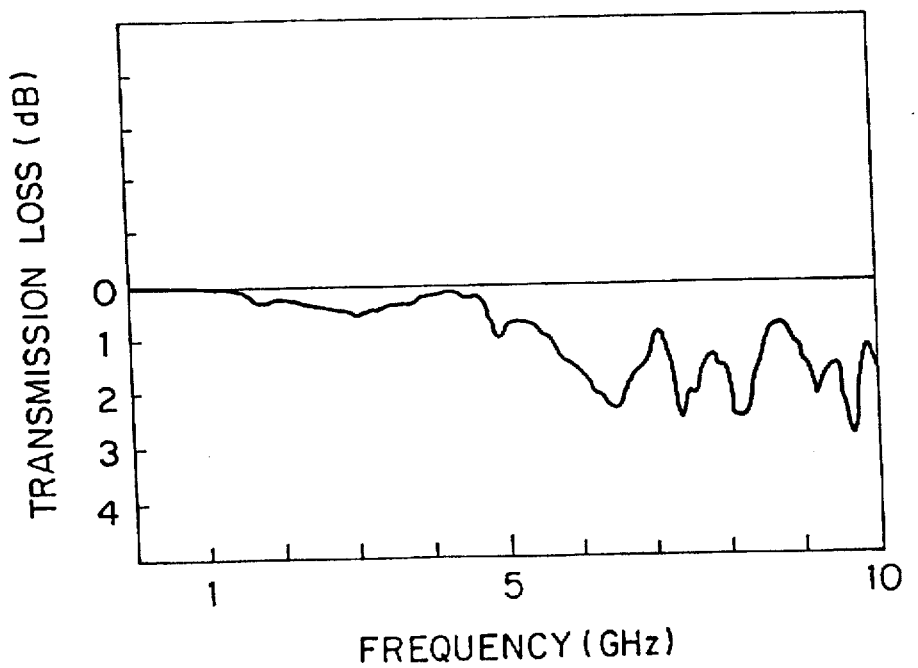
FIG. 6 is a diagram showing one example of the relation between the frequency and the transmission loss obtained of signal lines in a conven-tional PGA package.

It is clearly noted from FIG. 6 that in the semiconductor package for comparison, the transmission loss increased in proportion as the frequency covered by the measurement increased. Thus this semiconductor package was deficient in transmission property of high-frequency signals. Though part of the signal wirings in the semiconductor package for comparison produced results similar to those in the semiconductor package of this embodiment, most of them produced such properties as shown in FIG. 6. These results indicate that the transmission properties were widely dispersed by the positions of the signal wirings.

The semiconductor package 1 of the embodiment described above uses as a multilayer wiring substrate the multilayer aluminum nitride substrate 2 which excels in thermal conductivity. The semiconductor package 1, accordingly, realizes necessary improvement in the ability to radiate heat. It is judged even from this point of view to be capable of preventing the semiconductor device from producing erroneous operations and enabling the semiconductor device to enjoy a heightened operating speed. It further permits reduction in the size of package and consequently admits addition to the numbers of input and output pins to be used in the package.

The multilayer ceramic substrate in the semiconductor package of this invention need not be limited to the multilayer aluminum nitride substrate. A multilayer aluminum oxide substrate or a multilayer silicon nitride substrate may be used instead. From the viewpoint of the ability to radiate heat mentioned above, however, it is preferable to use a multilayer aluminum nitride substrate. The semiconductor package 1 mentioned above is advantageously used for mounting thereon such a semiconductor device as a CPU device, for instance, which has been enabled to acquire an exalted scale of integration and produce an increased operating speed.

In the semiconductor package 1 of the embodiment described above, the group of input and output pins 3 are so disposed that every signal pin S is positioned adjacently to one ground pin G or one power source pin P without fail. This invention does not demand all the signal pins S to meet this particular positional adjacency. The freedom of design contemplated by this invention in having a semiconductor device mounted on a semiconductor package can be maintained at an amply high level by causing at least 50% or more of the signal pins S to be so disposed that each of them may be positioned adjacently to at least one ground pin G or power source pin P.

In the case of a 16-bit CPU, for example, it is necessary that at least 16 signal lines possess an excellent high-frequency transmission property. By the same token, at least 32 signal lines in the case of a 32-bit CPU and at least 64 signal lines in the case of a 64-bit CPU are demanded to possess an excellent high-frequency transmission property. When the semiconductor package has not less than 50% of the signal pins S thereof so disposed that each of them may be positioned adjacently to at least one ground pin G or power source pin P, therefore, it can be fully adapted to admit use of various kinds of CPU mentioned above.

All the signal pins S are not necessarily demanded to be so disposed that each of them may be positioned adjacently to one ground pin G or power source pin P. To heighten the freedom of arrangement of the input and output pins, it is preferable that 50 to 80% of the signal pins S be so disposed that each of them may be positioned adjacently to one ground pin G or power source pin P. The group of input and output pins 3 which are arranged in this manner produce substantially the same effect as those of the embodiment described above and, moreover, contribute to exalting the freedom of arrangement of input and output pins.

Figure 7:
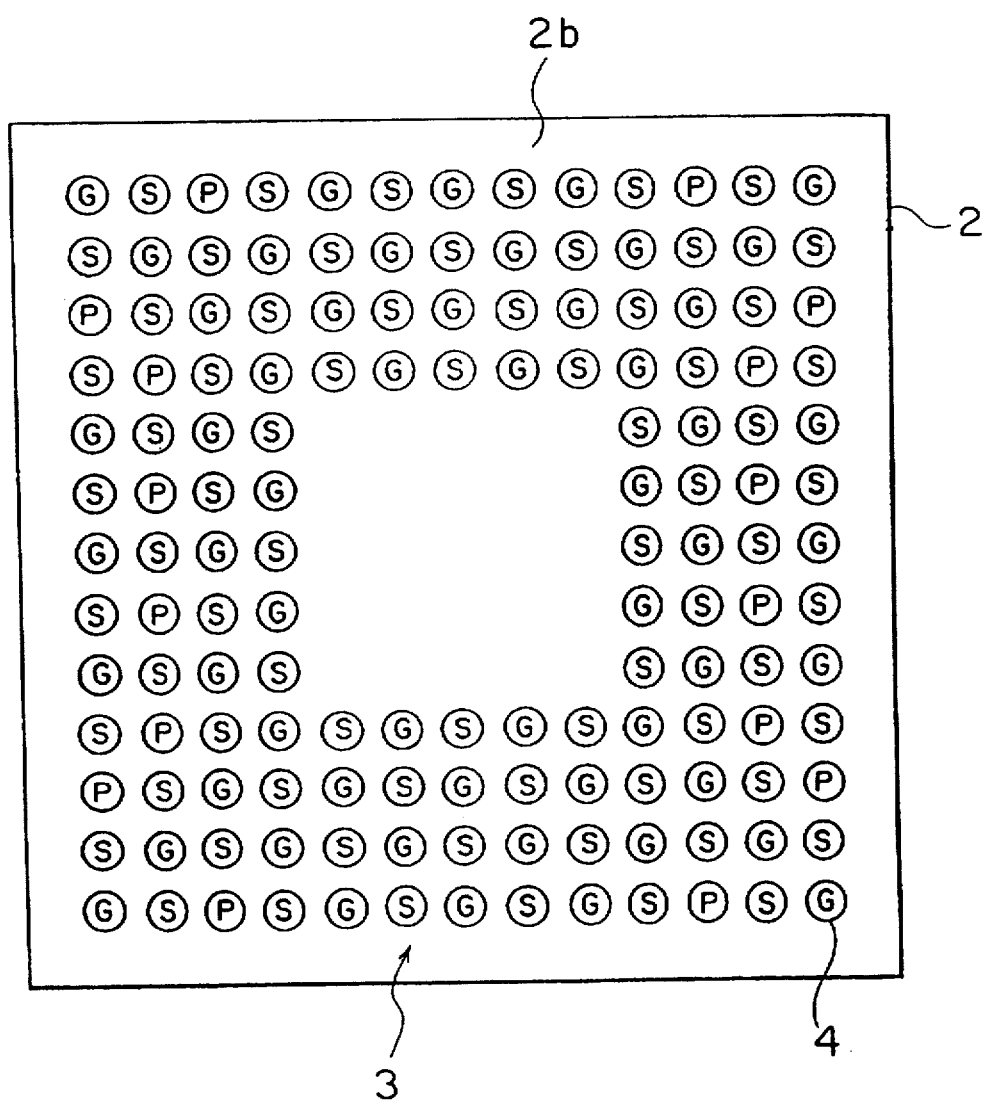
FIG. 7 is a diagram showing another example of the layout of input and output pins in the PGA package shown in FIG. 1.

The arrangement of the group of input and output pins 3 in the semiconductor package of this invention is required to be such that at least one of the positions adjacent to every signal pin S may be occupied by a ground pin G or a power source pin P as shown in FIG. 2. Further, it is permissible that the four positions adjacent to every signal pin S be occupied wholly by ground pins G or power source pins P as shown in FIG. 7, for example. In this case, the transmission properties of high-frequency signals can be improved to a greater extent and the dispersion of the transmission properties can be further repressed.

Figure 8:
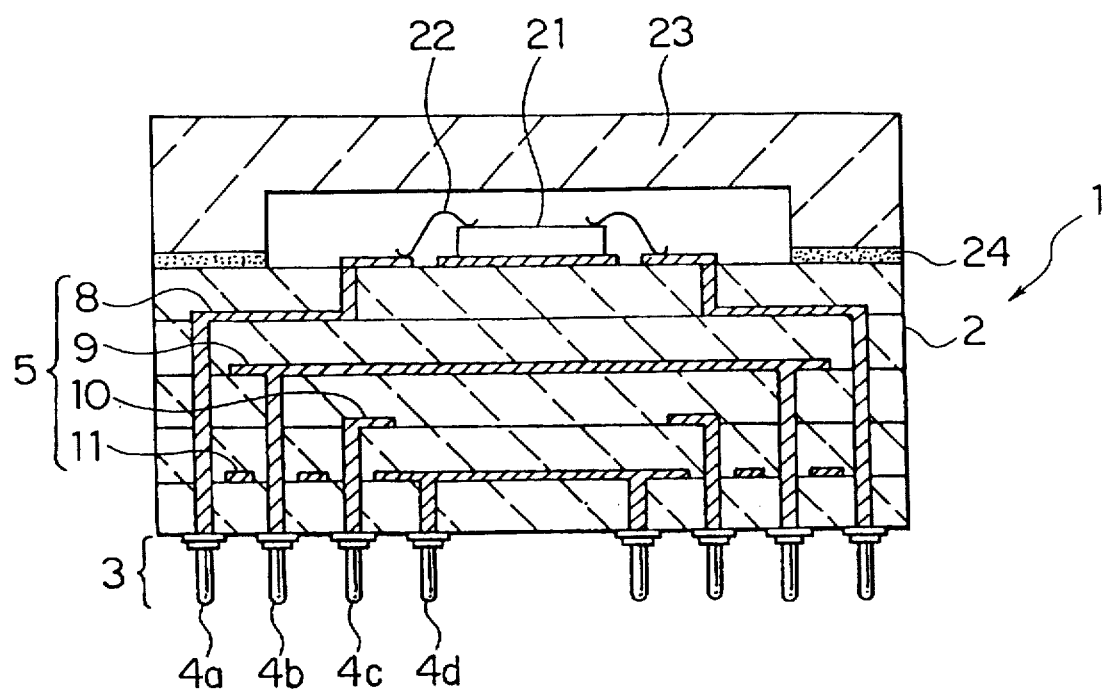
FIG. 8 is a diagram showing one example of the structure of package parts formed by mounting a semiconductor device on the PGA package shown in FIG. 1.

The semiconductor package 1 of the embodiment described above is used as a package part (semiconductor part) by having a semiconductor device 21 mounted thereon as shown in FIG. 8, for example. Specifically, the semiconductor device 21 is mounted to the chip mounting part 6 of the multilayer aluminum nitride substrate 2. The semiconductor device 21 is electrically connected to the surface wiring layer 7 through the medium of bonding wires 22.

Further, the semiconductor device 21 is airtightly sealed by being covered with a sealing member 23 which is made of a sintered aluminum nitride mass. The sealing member 23 made of aluminum nitride in a cross section of the shape of three sides of a square is so joined to the semiconductor package 1 that the end faces of the projecting ridge parts thereof may collide with the semiconductor device-mounting surface of the multilayer aluminum nitride substrate 2 and the depressed part of the cross section thereof may accommodate the semiconductor device 21 therein. The union of the multilayer aluminum nitride substrate 2 and the sealing member 23 made of aluminum nitride is attained by means of Pb—Sn solder, Au—Sn solder, or glass, for example.

The embodiment described above represents a case of applying the semiconductor package of this invention in a PGA package which uses input and output pins as input and output terminals. It can be applied in a semiconductor package having other input and output terminals such as, for example, a BGA package which uses input and output bumps as input and output terminals.

Figure 9:
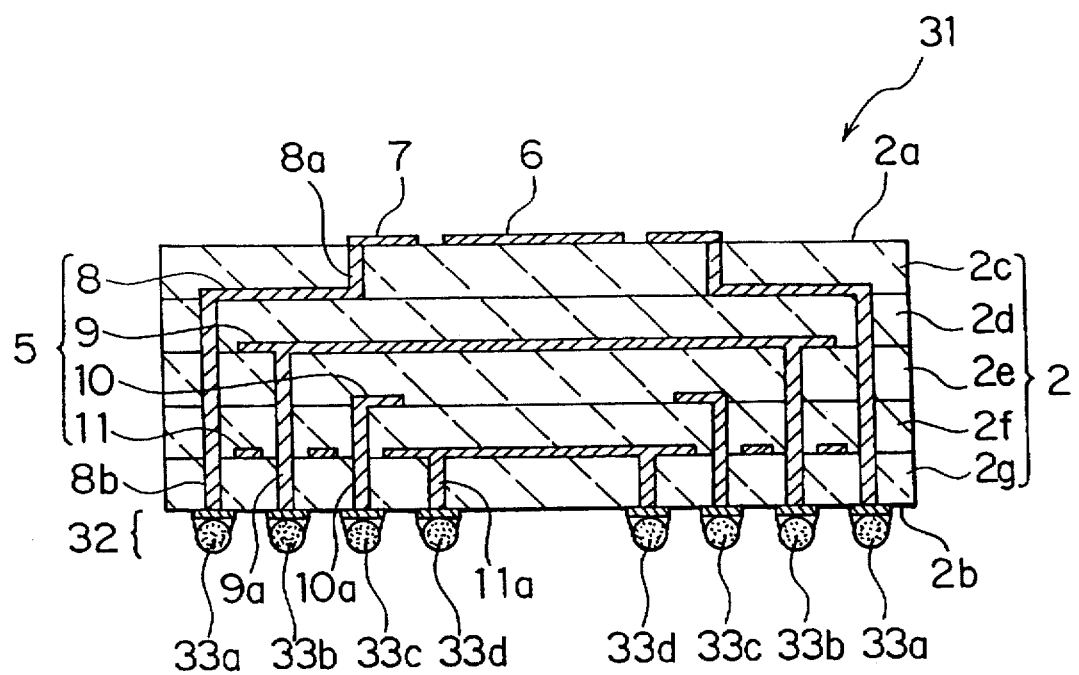
FIG. 9 is a cross section showing the structure of one example of a semiconductor package of this invention applied to a BGA package.

FIG. 9 is a cross section showing the structure of one example of applying the semiconductor package of this invention in a BGA package. A BGA package 31 shown in FIG. 9 is provided with a group of bump terminals 32 (bump terminals 33) arrayed on the terminal-forming surface 2b of the multilayer aluminum nitride substrate 2. The bump terminals 33 have been formed by joining solder balls to the terminal-forming surface 2b. The structure of the BGA package is identical with that of the PGA package 1 shown in FIG. 1, except for the group of bump terminals 32.

Bump terminals 33a, 33c are signal terminals. Then a bump terminal 33b is a ground terminal and a bump terminal 33d is a ground terminal. Even in the BGA package 31 which have such bump terminals 33 arranged as described above, the high-frequency transmission properties of signal wirings can be improved in the same manner as in the PGA package 1 mentioned above. When this BGA package 31 has a semiconductor device of any kind mounted thereof, it prevents the semiconductor from producing an erroneous operation and enables it to produce a perfect operation.

The embodiments described above represent cases of having a semiconductor device mounted on one main surface of the multilayer aluminum nitride substrate 2. This invention need not be limited to these embodiments but may be applied in a semiconductor package having cavities therein.

JP-U-7-27,164 discloses a semiconductor device which has leads as signal lines and leads as ground lines or power source lines alternately arranged on a flat package. It concerns such a package as the QFP requires use of lead frames. It is clearly different in structure from the PGA or BGA semiconductor package using a multilayer ceramic substrate as contemplated by this invention. Further, this invention has solved such problems as concern the return current which is peculiar to the type of semiconductor package which uses a multilayer ceramic substrate. Also from this point of view, what is aimed at by this invention is different from the semiconductor device disclosed in the publication mentioned above.

Besides, since the PGA or BGA semiconductor package which is contemplated by this invention by nature has 30 to 40% of the input and output terminals thereof adapted to serve as ground terminals or power source terminals, it realizes the arrangement of terminals described above without requiring addition to the numbers of ground terminals and power source terminals. In contrast, the QFP package necessitates addition to the number of ground leads and power source leads and suffers a proportionate decrease in the number of leads for signal lines. This decrease is contrary to the addition to the number of input and output signals in the semiconductor device contemplated by this invention.

Further, the QFP package requires the leads to be directly connected electrically to the semiconductor device. The arrange-ment of these leads, accordingly, imposes inevitably a limit on the positions for the electrodes on the semiconductor device side. In contrast, this invention allows the signal wirings to be freely drawn around in the inner wiring layer and, therefore, do not particularly suffer the positions for electrodes to be limited on the semiconductor device side. The semiconductor package of this invention, therefore, allows a semiconductor device of a varying kind to be freely mounted thereon. In this respect, this invention differs widely from the invention of the publication mentioned above.

It is clearly remarked from the embodiments described above that the semiconductor package of this invention obtains perfect transmission properties of signals of such a high frequency as exceeds the order of GHz and, at the same time, represses the dispersion in the transmission properties. This semiconductor package, therefore, enables a semiconductor device of varying design adapted to operate at a high speed to be freely mounted thereon, with the semiconductor device prevented from producing an erroneous operation. Owing to all these factors, this invention provides a semiconductor package which enables a semi-conductor device practically to realize exaltation of the scale of integration and addition to the operating speed.

What is claimed is:

1. A semiconductor package comprising:
    a multilayer ceramic substrate having an upper surface for mounting a semi-conductor device thereon, a lower surface for forming a plurality of input and output terminals thereon and an inner wiring layer electrically connected to said semiconductor device, and
    wherein the plurality of input and output terminals are electrically connected to said inner wiring layer, the plurality of input and output terminals comprising:
        signal terminals, ground terminals, and power source terminals disposed on the lower surface of said multilayer ceramic substrate and wherein at least half of said signal terminals are disposed adjacent to at least one of the ground terminals and the power source terminals.

2. The semiconductor package according to claim 1, wherein all said signal terminals are disposed adjacently to at least one of said ground terminals or said power source terminals.

3. The semiconductor package according to claim 1, wherein said input and output terminals are arranged on the lower surface of said multilayer ceramic substrate in a latticelike pattern and at least one terminal adjacent to every signal terminal is one of said ground terminals and said power source terminals.

4. The semiconductor package according to claim 1, wherein said inner wiring layer has a multilayered structure comprising a signal wiring layer, a ground wiring layer, and a power source wiring layer, said signal wiring layer and at least one of said ground wiring layer and said power source wiring layer are alternately superposed to form said multilayered structure.

5. The semiconductor package according to claim 1, wherein said multilayer ceramic substrate is a multilayer aluminum nitride substrate.

6. The semiconductor package according to claim 1, wherein said input and output terminals are pin terminals or bump terminals.

7. A semiconductor package comprising:

a multilayer ceramic substrate having an upper surface for mounting a semiconductor device thereon and a lower surface for forming terminals thereon, a multilayered inner wiring layer disposed in said multilayer ceramic substrate said inner wiring layer comprising a signal wiring layer, a ground wiring layer, and a power source wiring layer, wherein at least either of said ground wiring layer and said power source wiring layer is planarly formed in said multilayer ceramic substrate, ground terminals electrically connected to said ground wiring layer and disposed on the lower surface of said multilayer ceramic substrate for forming terminals thereon, power source terminals electrically connected to said power source wiring layer and disposed on the lower surface of said multilayer ceramic substrate for forming terminals thereon, and signal terminals electrically connected to said signal wiring layer and disposed on the lower surface of said multilayer ceramic substrate for forming terminals thereon, wherein at least half of said signal terminals are adjacent to at least one of the ground terminals and the power source terminals.

8. The semiconductor package according to claim 7, wherein all said signal terminals are disposed adjacently to at least one of said ground terminals or said power source terminals.

9. The semiconductor package according to claim 7, wherein said ground terminals, said power source terminals, and said signal terminals are arranged on the lower surface of said multilayer ceramic substrate in a latticelike pattern and at least one terminal adjacent to every signal terminal is one of said ground terminals and said power source terminals.

10. The semiconductor package according to claim 7, wherein said signal wiring layer and either of said ground wiring layer and said power source wiring layer are alternately superposed to form said multilayer ceramic substrate.

11. The semiconductor package according to claim 7, wherein said multilayer ceramic substrate is a multilayer aluminum nitride substrate.

12. The semiconductor package according to claim 7, wherein said ground terminals, said power source terminals, and said signal terminals are pin terminals or bump terminals.

* * * * *

UNITED STATES PATENT AND TRADEMARK OFFICE
CERTIFICATE OF CORRECTION

PATENT NO. : 5,714,801
DATED : February 03, 1998
INVENTOR(S) : Keiichi YANO et al.

It is certified that error appears in the above-identified patent and that said Letters Patent is hereby corrected as shown below:

Claim 1, column 10, line 51, "semi-conductor" should read --semiconductor--.

Claim 1, column 10, line 53, after "thereon", insert --,--.

Claim 1, column 10, line 60, after "substrate", insert --,--.

Claim 7, column 11, line 25, after "substrate", insert --,--.

Signed and Sealed this

Twentieth Day of April, 1999

*Attest:*

Q. TODD DICKINSON

*Attesting Officer*     *Acting Commissioner of Patents and Trademarks*